INVENTOR
GEOFFREY DAVID MASKENS

July 25, 1967 G. D. MASKENS 3,333,068

PRINTED-CIRCUIT DIGITAL ENCODER WITH IMPROVED PRINTED CIRCUIT AND MOVABLE CONTACT STRUCTURE

Filed Feb. 15, 1966 2 Sheets-Sheet 2

INVENTOR
GEOFFREY DAVID MASKENS

United States Patent Office 3,333,068
Patented July 25, 1967

3,333,068

PRINTED-CIRCUIT DIGITAL ENCODER WITH IMPROVED PRINTED CIRCUIT AND MOVABLE CONTACT STRUCTURE

Geoffrey David Maskens, Farnborough, England, assignor to The Solartron Electronic Group Limited, Farnborough, Hampshire, England, a corporation of the United Kingdom Filed Feb. 15, 1966, Ser. No. 527,580
Claims priority, application Great Britain Feb. 17, 1965, 6,886/65
8 Claims. (Cl. 200—11)

This invention relates to shaft-position encoders and in particular to shaft-position encoders of the type having a contact bearer rotatable relative to a printed circuit.

In a known shaft-position encoder of the type specified, a disc of an insulating material is so spaced from a plane printed circuit of concentric pattern that the ends of resilient contacts mounted on a face of the disc press against the face of the printed circuit. The disc, referred to hereinafter as a contact bearer, is so mounted on a shaft whose angular position is required to be known, as to be parallel to the face of the printed circuit.

The concentric pattern of the printed circuit is designed to enable an electric signal representative of the angular position of the shaft to be obtained in digital form.

A factor upon which the performance and useful life of such a shaft-position encoder depends is the pressure exerted by the contacts against the face of the printed circuit. In a known method of ensuring that the optimum pressure is established and maintained, the separation of the contact bearer from the face of the printed circuit is adjusted until the required deflection of the contacts is attained. The tolerance allowable in fixing the separation is commonly as little as 0.002 inch.

In known encoders, the construction is made rigid to achieve the required accuracy, the time and expense involved consequently being considerable.

It is therefore an object of the invention to provide a shaft-position encoder which may be easily and quickly assembled without regard to maintaining close tolerance between the rotating and stationary components thereof.

It is another object of the invention to provide a shaft-position encoder in which component adjustments after assembly to conform to operating specifications are unnecessary.

According to the present invention a shaft-position encoder includes a board bearing a first electrical circuit, a post whose axis is a line passing perpendicularly through the board, a rotatable member mounted rotatably on the post and bearing a second circuit, three spacing members disposed between the board and the rotatable member at spaced non-collinear locations to cooperate with a spring located between the rotatable member and a backing member in holding the rotatable member at a fixed axial location relative to the board, each spacing member having a low coefficient of friction to permit sliding during rotation of the rotatable member relative to the board, at least one of the circuits including resilient means adapted to effect intermittent electrical contact between the circuits on rotation of the rotatable member.

The above mentioned and other features and objects of this invention will become more apparent by reference to the following description taken in conjunction with the accompanying drawings in which.

Figure 1:
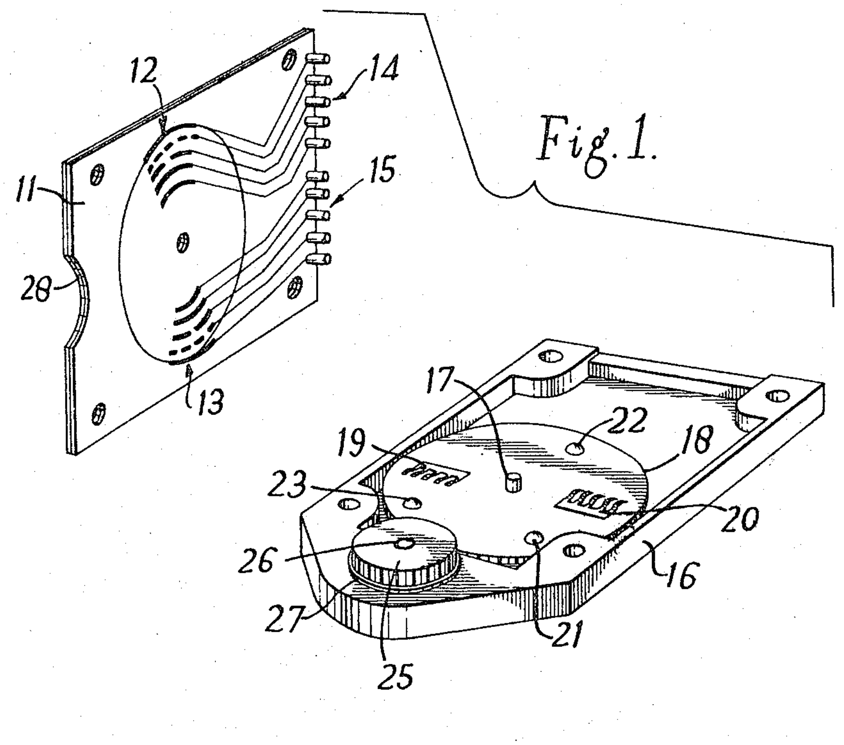
FIGURE 1 shows partially disassembled an embodiment of the invention.

Referring to FIGURE 1, in one embodiment for use in a printing digital voltmeter, a shaft-position encoder has a printed circuit formed on a board or sheet 11 of suitable insulating material such as aluminium back laminate. Arcuate tracks form two independent four bit codes on the printed circuit and have conducting paths leading to two sets 14 and 15 of five contact pins secured in one end of the board.

The tracks are arranged in two groups 12 and 13 corresponding to the two codes and are concentric about a point which will be referred to hereinafter as the geometrical center of the printed circuit. The two groups 12 and 13 lie in vertically opposite 90° segments.

Figure 2:
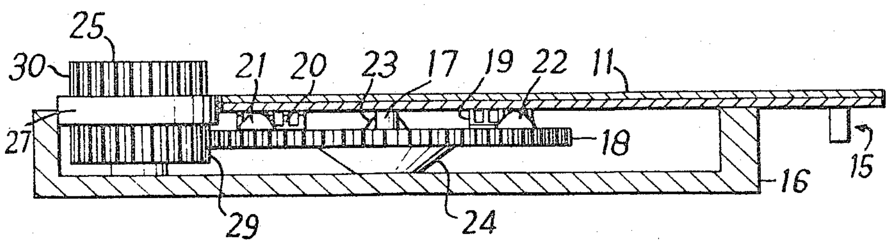
FIGURE 2 is a sectional view of the embodiment shown in FIGURE 1.
Figure 3:
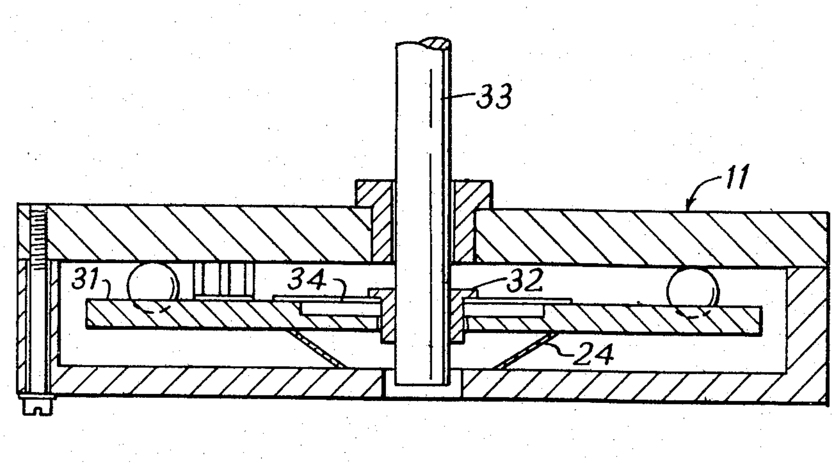
FIGURE 3 is a sectional view of another embodiment.
Figure 4:
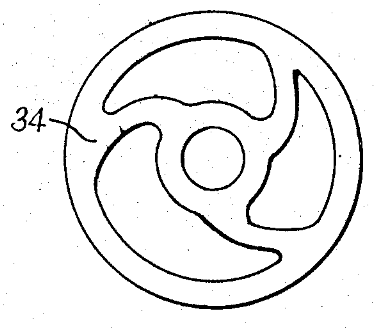
FIGURE 4 is a plan view of a spider.

The printed circuit is covered by a moulded cover 16 to which the board 11 is secured. The end of board 11, to which contact pins 14, 15 are secured, extends beyond the cover 16, as shown in FIGURE 2. Extending from the cover 16 is a post 17 whose axis is a line passing perpendicularly through the plane of the printed circuit at the geometrical center thereof when the encoder is assembled. A contact bearer 18, which is a thin disc of electrically insulating material, is rotatably mounted on the post 17 by means of a hole drilled at the center of the disc. The post 17 and the hole are precisely formed to provide a running fit.

The comb shaped contacts 19 and 20 are mounted on the contact bearer 18 diametrically opposite to each other and have their respective teeth extending in opposite directions. The contacts are formed from a resilient material.

Also secured on the face of the contact bearer 18 are three identical nylon hemispheres 21, 22 and 23 near the edge at points located substantially at the vertices of an equilateral triangle.

Referring to FIGURE 2, a light spring washer 24 mounted on the post 17 maintains the hemispheres 21, 22 and 23 in contact with the board 11 against the resilience of the contacts 19 and 20. The force exerted by the spring washer 24 has an order of magnitude greater than the total force exerted by the contacts 19 and 20. The cover 16 acts as a backing member for the spring washer 24. By this arrangement the contact bearer 18 is constrained to move solely rotationally, the radii of the hemispheres 21, 22 and 23 being identical. The magnitude of the radii and the shape and dimensions of the contacts 19 and 20 against the printed circuit.

The edge of the contact bearer 18 is toothed to engage with a nylon pinion 25 mounted on a second post 26 extending from the cover 16. The pinion 25 has two sets of gear teeth having equal major diameters and separated by a smooth central portion 27 of greater diameter than the major diameter of the gear teeth. The smooth central portion fits into a circular opening formed by a depression in the cover 16 in cooperation with an arcuate edge 28 in the end of the board 11 opposite to the end securing the contact pins. Entry of dust into the space between the board 11 and the cover 16 is thereby minimized.

One set of gear teeth 29 on the pinion 25 engages with the teeth of the contact bearer 18. The other set of gear teeth 30, on the pinion 25 can be engaged with a gear external to the shaft-position encoder.

In operation, a shaft of which the angular position is required to be known is coupled to the contact bearer 18 through the pinion 25 by way of the gear external to the shaft-position encoder. Consequently, if the shaft rotates, the contact bearer 18 rotates with the shaft thereby altering the positions of the contacts 19 and 20 relative to the two groups 12 and 13 of tracks of the printed circuit. Thus electric signals representative of the angular position of the shaft can be obtained from the groups of pins 14 and 15, the extreme pin in each group being supplied from a constant voltage current source.

The electric signals obtained from the shaft-position encoder are affected by the nature of the contact between the contacts 19 and 20 and the printed circuit. Also, the useful life of the encoder depends upon the nature of the contact. The optimum pressure exerted by the contacts against the face of the printed circuit can be established and maintained as a result of the present invention.

In another embodiment of the invention, a contact bearer 31 has no teeth and there is no pinion 25, instead a hollow post 32 locates the contact bearer 31 and a driving shaft 33 passing through the post 32. A thin spider 34 is mounted on the driving shaft 33 and secured to the contact bearer 31. The spider 34 is designed to have axial and tilting compliance but to be capable of transmitting rotational motion.

Further embodiments can be constructed in which three projections are mounted on the board supporting the printed circuit, the contact bearer being rotated against the projections.

An alternative to hemispherical projections fixedly mounted on either the contact bearer or the printed circuit board is provided in the use of spheres located in depressions or channels in the contact bearer or the printed circuit board.

In a yet further embodiment, a rotatable member is mounted rotatably on a post extending from a board bearing a printed circuit, a light spring and a circlip on the post maintaining three hemispheres on the rotatable member in contact with the board, the circlip acting as a backing member for the spring.

Since many changes could be made in the above construction and many apparently widely-different embodiments of this invention could be made without departing from the scope thereof, it is intended that all matter contained in the above description or shown in the accompanying drawings shall be interpreted as illustrative and not in a limiting sense.

I claim:

1. A shaft-position encoder including a sheet of insulating material and a first electrical circuit carried by the sheet, a post whose axis is a line passing perpendicularly through the sheet, a rotatable member mounted rotatably on the post and a second circuit carried by the said member, a backing member, spring means located between the rotatable member and the backing member, a plurality of spacing members disposed between the sheet and the rotatable member at spaced, fixed locations on the rotatable member and each having a low coefficient of friction to permit sliding during rotation of the rotatable member relative to the board, the spacing members cooperating with the spring means in holding the rotatable member at a fixed axial location relative to the sheet, and resilient means in at least one of the circuits for effecting intermittent electrical contact between the circuits on rotation of the rotatable member.

2. An encoder according to claim 1, including a pinion for coupling to a shaft of which the angular position is required to be encoded, the said rotatable member being in the form of a toothed wheel rotatably engaged with the pinion for rotation thereby.

3. An encoder according to claim 2, including an enclosure sealed against the entry of dust, the said rotatable member being mounted within the enclosure, and the said pinion extending through a circular aperture in the enclosure and having a plain cylindrical portion which is rotatable in and closes the circular aperture to the entry of dust.

4. An encoder according to claim 1, including a driving shaft coaxial with the said post, and a spider secured to the driving shaft and to the said rotatable member and having axial and tilting compliance but capable of transmitting rotational motion from the driving shaft to the said rotatable member.

5. A shaft-position encoder including a sheet of insulating material and a planar printed circuit of concentric pattern mounted on the sheet, a post whose axis is a line passing perpendicularly through the plane of the printed circuit, a contact bearer mounted rotatably on the post, a backing member, a spring located between the contact bearer and the backing member, a plurality of spacing members disposed between the board and the contact bearer at spaced, fixed locations on the contact bearer to cooperate with the spring in holding the contact bearer at a fixed axial location relative to the sheet, each spacing member sliding against the sheet and having a low coefficient of friction relative thereto, a plurality of resilient metal contacts diametrically disposed on said contact bearer, each of said contacts being in the form of a comb with teeth, the teeth of each comb extending in opposite respective directions and bearing slidably against the printed circuit under the action of the spring, intermittent electrical contact between the said teeth and the said printed circuit occurring upon rotation of the rotatable member relative to the said printed circuit.

6. An encoder according to claim 5, including a pinion for coupling to a shaft of which the angular position is required to be encoded, the said rotatable member being in the form of a toothed wheel rotatably engaged with the pinion for rotation thereby.

7. An encoder according to claim 6, including an enclosure sealed against the entry of dust, and said rotatable member being mounted within the enclosure, and the said pinion extending through a circular aperture in the enclosure and having a smooth cylindrical portion which is rotatable in and closes the circular aperture to the entry of dust.

8. An encoder according to claim 5, including a driving shaft coaxial with said post, and a spider secured to the driving shaft and to the said rotatable member and having axial and tilting compliance but capable of transmitting rotational motion from the driving shaft to the said rotatable member.

References Cited

UNITED STATES PATENTS

| | | | |
|---|---|---|---|
| 2,205,482 | 6/1940 | Krieger | 200—11.11 |
| 3,089,923 | 5/1963 | Wright | 200—11 X |

ROBERT K. SCHAEFER, *Primary Examiner.*

J. R. SCOTT, *Assistant Examiner.*

UNITED STATES PATENT OFFICE
CERTIFICATE OF CORRECTION

Patent No. 3,333,068 July 25, 1967

Geoffrey David Maskens

It is hereby certified that error appears in the above numbered patent requiring correction and that the said Letters Patent should read as corrected below.

Column 2, line 44, after "20" insert -- are chosen to provide the optimum of pressure exerted by the contacts 19 and 20 --.

Signed and sealed this 24th day of September 1968.

(SEAL)
Attest:

Edward M. Fletcher, Jr.
Attesting Officer

EDWARD J. BRENNER
Commissioner of Patents